US005260153A

United States Patent [19]

Ohtake et al.

[11] Patent Number: 5,260,153

[45] Date of Patent: Nov. 9, 1993

[54] APERTURE PATTERN PRINTING PLATE

[75] Inventors: Yasuhisa Ohtake; Yasushi Magaki; Mitsuaki Yamazaki; Seiji Sagou; Hiroshi Tanaka, all of Fukaya, Japan

[73] Assignee: Kabushiki Kaisha Toshiba, Kawasaki, Japan

[21] Appl. No.: 791,330

[22] Filed: Nov. 14, 1991

Related U.S. Application Data

[62] Division of Ser. No. 486,746, Mar. 1, 1990, Pat. No. 5,128,224.

[30] Foreign Application Priority Data

Mar. 2, 1989 [JP] Japan .................................. 1-48513

[51] Int. Cl.[5] ............................................. G03F 9/00

[52] U.S. Cl. ......................................... 430/23; 430/5; 430/292; 430/302; 430/325

[58] Field of Search ..................... 430/5, 23, 292, 302, 430/325, 327

[56] References Cited

U.S. PATENT DOCUMENTS 3,973,965 8/1976 Suzuki et al. ........................... 430/5
4,656,107 3/1987 Moscony et al. ..................... 430/23
4,669,871 6/1987 Wetzel et al. .......................... 430/5

*Primary Examiner*—Marion E. McCamish
*Assistant Examiner*—S. Rosasco
*Attorney, Agent, or Firm*—Cushman, Darby & Cushman

[57] ABSTRACT

An aperture pattern printing plate for manufacturing a shadow mask having an opaque layer form in parts on a surface of a transparent plate. The parts of the opaque layer corresponding to apertures in an effective area of the shadow mask. The opaque layer projecting from the transparent plate, and having a thickness of 30 to 50 μm.

9 Claims, 6 Drawing Sheets

APERTURE PATTERN PRINTING PLATE

This is a division of application Ser. No. 07/846,746, filed Mar. 1, 1990, now U.S. Pat. No. 5,128,224.

BACKGROUND OF THE INVENTION

1. Field of the Invention

This invention concerns an aperture mask pattern printing plate for shadow mask and method of manufacturing the same.

2. Description of the Related Art

Shadow masks commonly used for color cathode tubes have a large number of apertures. These shadow masks are used to allow three electron beams corresponding to red, green and blue emitted from the electron gun to impinge on each corresponding phosphor through the apertures. They are usually manufactured by a photo-etching process, for example as described below.

Firstly, a shadow mask substrate consisting of a continuous strip of metal plate is degreased and washed, and a photoresist layer of a given thickness is formed on both the principal surfaces of the mask. Next, a pair of aperture pattern printing plates which are opaque to light at points corresponding to the apertures of the mask, are laid over the photoresist layer on each surface, brought into close contact with them. The photoresist layers are exposed to ultraviolet light through the printing plate. The unexposed parts of the photoresist layers corresponding to the apertures of the mask are dissolved and removed by a warm water spray, and the mask substrate is dried and baked so as to leave a residual photoresist layer resistant to etching at points other than the apertures. An etchant is sprayed onto both surfaces of the mask substrate to perforate apertures. The shadow mask is then obtained by washing, removing the photoresist layer washing again and drying.

The pattern printing plates used in the exposure process are generally emulsion type plates carrying substantially flat, smooth photosensitive emulsion films which are opaque to light at points corresponding to the apertures of the mask, and transparent at other points. An original plate is first manufactured by a pattern generator known as a photo plotter. A master pattern is formed from the original plate by contact printing onto a transparent plate with a photosensitive emulsion film on one of its principal surfaces. Pattern printing plates are then obtained by contact printing of this master pattern onto other transparent plates in the same way as was done with the original plate.

Since the proportion occupied by opaque parts is as low as 5–15% in these printing plates, the probability that pinhole defects will occur is low. Moreover, even if such defects did occur in the parts corresponding to the apertures of the shadow mask, the mask substrate corresponding to these parts is etched out in the etching process after printing, and consequently they are unlikely to remain as defects.

On the master pattern, however, opaque parts and transparent parts are the exact reverse of those on the printing plates, and the proportion occupied by opaque parts is as high as 85–95%. The probability of defects occurring is therefore high. Moreover, in the printing process pinholes occurring in the master pattern form undesirable opaque parts in addition to the specified opaque parts in the pattern printing plates. After these undesirable opaque parts are printed onto the shadow mask substrate, they are subjected to etching in the etching process, and the result is that parts other than the specified parts corresponding to apertures are etched. To prevent such defects, the pin-holes which occur when the master pattern is formed are corrected with an opaque ink or the like. The correction however requires a great deal of time, and as the places which are corrected form protrusions, contact is poorer when reversing onto the pattern printing plate. Irregularities may thus occur easily in the reversed pattern. Recently, shadow mask patterns are being manufactured in finer detail, with a finer pattern pitch and with a smaller pattern width. It is therefore becoming more difficult to make corrections, and as irregularities of the above kind may occur easily, there is a high probability that the quality of the shadow mask will decrease. Moreover, as the number of pattern reversals involved in the manufacture of pattern printing plates increases, the probability of pattern defects increases.

The substrate of the pattern printing plates may, for example, consist of float glass. The layer of photosensitive emulsion with the pattern is formed on this substrate, and the surface of the emulsion layer is substantially flat. When the pattern is printed onto the shadow mask substrate using an exposure device, as disclosed for example in Examined Published Japanese Patent No. 56-13298, the pattern printing plate and a photoresist layer formed on the shadow mask substrate are brought into intimate contact. This contact proceeds from the periphery of the plate and toward its center. If there are no air passages in the center of the plate, therefore, a fairly long time of approx. 80–approx. 120 seconds is required depending on the size of the pattern to achieve a completely vacuum-tight contact of the central part. To shorten the time required for contact, a means is proposed in Examined Published Japanese Patent No, 53-28092 whereby air passages in the plate are provided in a part corresponding to a non-effective surface of the shadow mask. Even using this means, however, removal of air from the central part of the pattern printing plate is not improved, and the time required to achieve vacuum-tight contact in this part still increases with the size of the pattern surface. Again, in Examined Published Japanese Patent No. 50-23273, a pattern printing plate is proposed wherein air passages are formed in a transparent layer around an opaque layer, together with a method of manufacturing said plate. In this method, however, the number of processes to form the air passages is greater than that normally required, and the number of pattern printing operations is also large. The probability of pattern defects occurring is therefore high. Further, when the pattern is printed on the shadow mask substrate using this pattern printing plate, light is scattered at the interfaces of the transparent layer and the opaque layer so that the dimensions of the pattern are easily altered. This pattern printing plate and its method of manufacture are therefore impractical.

With conventional printing plates, therefore, a considerable time was required to achieve a vacuum-tight contact between the pattern printing plate and the shadow mask substrate in the manufacture of the mask, and it was thus impossible to increase productivity. Moreover the production process itself was complex, defects easily occurred in the pattern, and a considerable time was required to correct the defects. These factors again made it difficult to increase productivity.

SUMMARY OF THE INVENTION

This invention aims to provide an aperture pattern printing plate wherein the occurrence of pattern defects is extremely low, the production process is simple, and the time required to achieve contact with the shadow mask in the shadow mask manufacturing process, is greatly reduced.

The pattern printing plate of this invention comprises a transparent plate, and an opaque layer formed on this transparent plate in parts corresponding to the apertures in the effective area of the shadow mask. This opaque layer has a thickness of 3 to 50 μm, and it is formed in such a way that it projects from the surface of the transparent plate.

The method used to manufacture the pattern printing plate of this invention comprises the steps of bringing a transparent plate having an unexposed photosensitive layer formed on at least one of the principal surfaces thereof, into contact with an original plate having opaque areas in the parts corresponding to the apertures in the effective area of a shadow mask; subjecting the photosensitive layer to a 1st exposure through the original plate; developing said photosensitive layer to render opaque the exposed parts; etching said opaque layer to remove it; carrying out a 2nd exposure to the unexposed parts of the transparent layer remaining on the transparent plate; and developing the exposed part of the photosensitive layer to render them opaque, thus forming a pattern corresponding to the pattern on the original plate.

According to the method of this invention, pattern reverse printing is a concurrent result of the etching and developing carried out during the manufacture of the pattern printing plate, and it is possible to print the pattern back to the original pattern without using a master pattern. In the pattern contact print procedure, therefore, it may be sufficient to reverse the pattern from the original plate to the pattern printing plate only once, and consequently, the probability of pattern defects is low. Further as, in the pattern printing plate of this invention, opaque areas project alone from the transparent plate, air passages exist between these areas on the surface of the plate carrying the opaque layer. These air passages extend over the whole effective surface of the shadow mask pattern, and so the time required to achieve a vacuum-tight contact between the plate and the shadow mask substrate in the manufacturing process is very much reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims and accompanying drawings.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
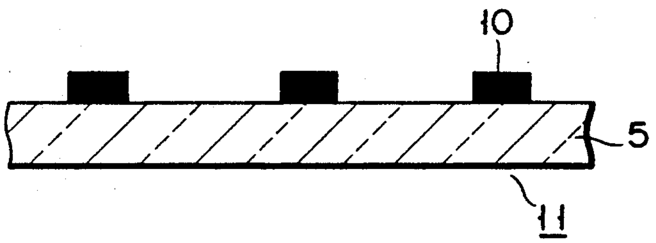
FIG. 1 is a sectional view showing part of one embodiment of the pattern printing plate of this invention.

In the pattern printing plate of this invention, an opaque layer of thickness 3 μm to 50 μm is formed in parts of a transparent plate corresponding to the apertures in the effective area of the shadow mask. FIG. 1 is a view showing one example of the pattern printing plate of this invention. As shown in FIG. 1, opaque layer 10 is formed such that it projects from transparent plate 5, and the gaps between the opaque areas of layer 10 constitute air passages.

Figure 7:
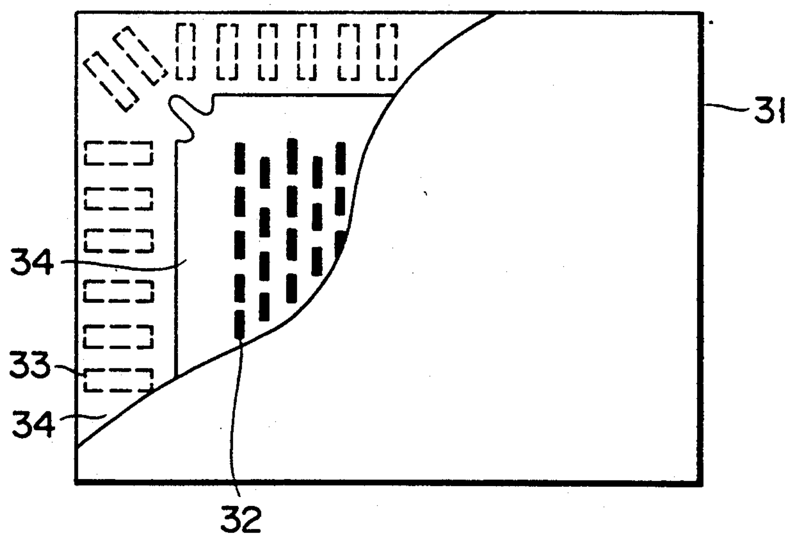
FIG. 7 is a plan view showing a pattern printing plate illustrating one embodiment of this invention.

Further, as shown in FIG. 7, the pattern printing plate of this invention may be provided with a transparent layer 33 of thickness 3 μm to 50 μm, and preferably of 5 μm to 30 μm, formed such that it projects from the non-effective area of transparent plate 34. The lateral surfaces of this transparent layer 33 constitute air passages, and a pattern printing plate 31 with air passages in the effective area and non-effective area is thus obtained.

The aperture pattern printing plate shown in FIG. 1 is manufactured as shown in FIG. 2A-2D.

Figure 2A:
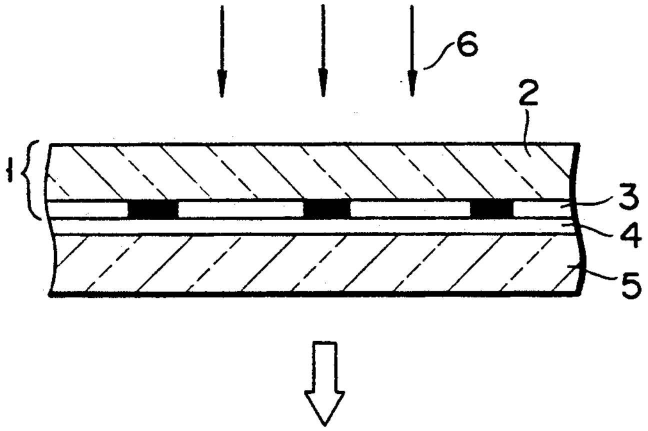
FIGS. 2A-2D are sectional views showing the process used to manufacture one embodiment of the pattern printing plate of this invention.

Firstly, as shown in FIG. 2A, a layer of a photosensitive agent is formed on at least one of the principal surfaces of transparent plate 5 which has two principal surfaces. The layer of photosensitive agent may consist, for example, of an emulsion containing silver bromide and gelatin. Next, a pattern original plate having opaque areas in parts corresponding to the apertures in the effective area of the shadow mask is prepared, and brought into close contact with said layers of photosensitive agent on the principal surface of the transparent plate. A 1st exposure is then carried out. The optical source used may for example be ultraviolet light. The layer of photosensitive agent is developed, whereupon the exposed area becomes opaque layer 7 and the non-exposed area is left as transparent layer 8. Opaque layer 7 is then removed by etching. A 2nd exposure is carried out on the unexposed transparent layer 8 remaining on the transparent plate. The plate is subsequently developed to form an opaque layer 10, and a pattern printing plate with the same pattern as that of the original plate is thus obtained.

A pattern printing plate may also be manufactured by preparing a pattern original plate with a pattern corresponding to the apertures in the effective area of the shadow mask, and a pattern corresponding to the protrusions required to form air passages in the noneffective area of the mask pattern, said 2nd exposure being carried out only in the effective area. The manufacturing procedure is otherwise the same as that described above. In this way, a pattern printing plate with air passages in both the effective area and noneffective area can be obtained.

According to this invention, an opaque layer 10 corresponding to the apertures in the effective area of the shadow mask is formed on transparent plate 5 so as to project from the plate as shown in FIG. 1. Air-passages are formed inside this projecting opaque layer 10. In the case of conventional pattern printing plates used to manufacture shadow masks, air in the center of the plate was not easily removed when the plate was brought into vacuum-tight contact with the shadow mask substrate. However, the pattern printing plate of this invention has air passages extending at least over the whole of the effective area, thus air is removed quickly from the whole assembly when the plate is brought into contact with the mask, and the time required for vacuum-tight contact is short. The productivity of the shadow mask manufacturing process is therefore improved.

According to the method of this invention, using an original plate, a layer of photosensitive agent remains only in parts corresponding to the apertures of the shadow mask as shown in FIG. 1, other parts being removed and a pattern being formed which projects from transparent plate 5. It is thus possible to reverse-print the reversed pattern from the original plate back to the original pattern even if exposures are made without a master pattern of the conventional type, and in this reversal printing process defects do not easily occur. Further, in the contact print procedure, there need be only one print from the pattern original plate to the pattern printing plate as shown in FIGS. 2A. Consequently, according to this invention, the number of pattern defects is drastically reduced, the time required to correct pattern defects is shortened, and productivity of pattern printing plates is improved.

The pattern printing plate of this invention may also be manufactured by performing a 1st exposure, and a 1st development of said photosensitive resin layer to form a master pattern which is the reverse pattern of the original, bringing said master pattern into close contact with transparent plate having unexposed photoresist layer formed on one of the principal surfaces thereof and performing a 2nd exposure, then performing a 2nd development of said photoresist layer, and removing the unexposed parts and coloring the exposed parts.

The pattern printing plate of this invention may further be obtained by removing the exposed parts in said 2nd exposure, forming an opaque layer in the gaps obtained, and then removing the unexposed parts.

We shall now give some examples to describe this invention in more detail, it being understood that the invention is not limited to them.

EXAMPLE 1

Figure 3:
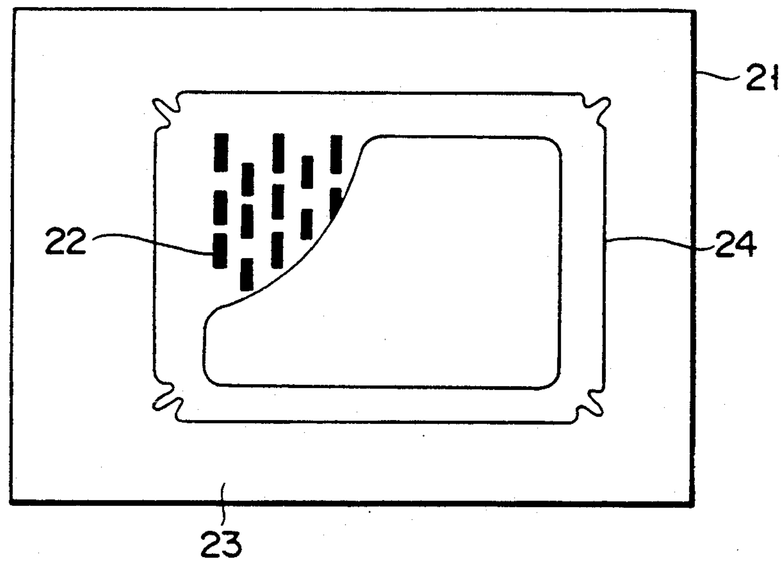
FIG. 3 is a view showing the structure of the pattern original plate in one embodiment of this invention.

A shadow mask pattern drawn on a dry glass plate (for example Kodak HRP) by for example a Gerber Photo Plotter was used as a original plate. As shown in FIG. 3, this original plate 21 has an opaque emulsion film 22 only in those parts where the shadow mask substrate is to be etched out by etchant, and a transparent emulsion film 23 in other parts.

As shown in FIG. 2A, an original plate 1 with an opaque emulsion film 2 and a transparent film 3, and a dry glass plate 5 with an unexposed photosensitive emulsion film 4 of thickness approx. 6 μm (for example Kodak HRP or LPP, or Konica PL), are arranged with their emulsion films facing each other in the dark room, and are brought into close contact using a vacuum system. The photosensitive emulsion film 4 is then irradiated by ultraviolet light or green light 6 through the original plate 1 in a 1st exposure.

Figure 2B:
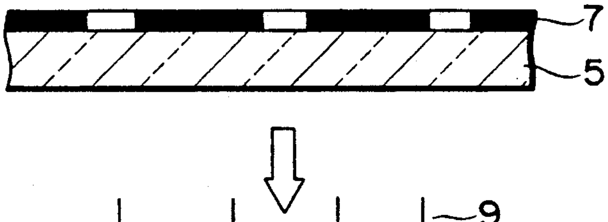

A 1st development is then performed as in ordinary photographic chemical processing at 20° C. (for example by Kodak Super RT Developer) for 3 to 4 minutes. As shown in FIG. 2(B), after forming an opaque emulsion film 7 with the reverse pattern to that of the original plate, the development is stopped by 3% glacial acetic acid. A solution of an oxidizing agent such as copper chloride or potassium dichromate and a solution of a resin decomposing agent such as ammonia or hydrogen peroxide are then mixed together, and a surfactant is added to give an emulsion etching solution. The pattern printing plate is immersed in this solution for 1 to 3 minutes.

Figure 2C:
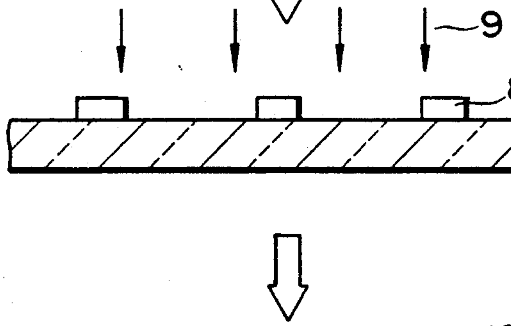

By performing this treatment, the opaque emulsion film 7 obtained in the 1st development is dissolved away so as to leave a transparent photosensitive emulsion film 8 as shown in FIG. 2(C). Subsequently, blackened silver which left when the emulsion was dissolved is wiped off gently in running water using lint free paper in a light room.

Figure 2D:
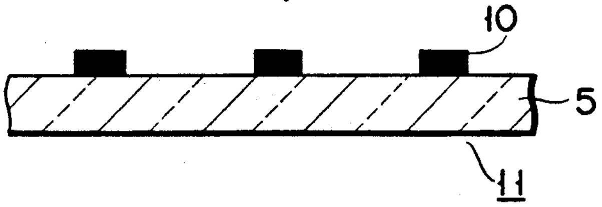

Next, the plate is irradiated with ultraviolet light or green light 9, developing nuclei are formed in the silver halides in transparent emulsion film 8, and a 2nd development is performed in developing solution in the same way as in the 1st development. This produces blackened silver and forms an emulsion film 10 which projects from the dry glass plate as shown in FIG. 2(D). The plate is then fixed, washed and dried, and the desired aperture pattern printing plate 11 is thus obtained. The thickness of the emulsion film 10 of this printing plate 11 was approximately 5 μm.

The thickness of emulsion film 10 should be approx. 3 μm–50 μm. The reasons for this are as follows.

Firstly, the dry glass plate used is generally made of float glass. Its surface is not completely flat, but has undulations in certain places. Moreover, the photoresist layer formed on the two principal surfaces of the shadow mask substrate has local undulations due to flowing of the photoresist in the coating or drying step, so that there come to be local variations of film thickness. If the thickness of the residual emulsion film is less than 3 μm, the local undulations in the glass substrate and the variations in the thickness of the photosensitive film lead to formation of insufficient air passages, and the desired reduction of time required to achieve vacuum-contact is not obtained. If on the other hand the thickness of the residual film is greater than 50 μm, foreign material adheres to the printing plate, and when the film is rubbed or brought into pressure contact, pattern defects are easily produced.

In this example, after the 1st development, opaque areas formed during developing are dissolved away. The emulsion film adheres strongly to the glass substrate, and as etching proceeds from the film surface, the cross-section of the remaining emulsion film tends to become trapezoidal. This shape change is affected of course by the exposure and developing conditions, but it is also largely affected by the etching conditions. If the cross-section of the emulsion film does become trapezoidal, the emulsion film in contact with the glass substrate will then be thinner at the edges, and the degree of blackening will decline. When the pattern is printed onto the shadow mask substrate with a photoresist layer on its two principal surfaces, therefore, the light screening effect of the opaque film declines.

The result is that irregularities easily arise in the dimensions of the pattern printed on the photoresist layer. It is found in tests however that even if the cross-section of the emulsion film is trapezoidal, there is no effect on quality of the shadow mask provided that the difference between the upper and lower sides of the trapezoid is within 5 to 30 μm. The tolerance for this difference of course depends strongly on the pattern dimensions.

As shown in FIG. 3, if the outer frame 24 of the pattern in the effective area of the shadow mask is formed by a continuous line, removal of the air inside the shadow mask pattern is obstructed. Air removal areas may therefore be machined out at several locations without affecting mask quality.

The number of defects occurring in the aperture pattern printing plate of this invention is therefore $\frac{1}{3}$–$\frac{1}{4}$ compared to conventional plates manufactured by 2 contact prints. Further, the pattern printing plate obtained was put into an actual exposure process, and a test was performed to see how the time required for vacuum-tight contact could be reduced without affecting mask quality. As a result, it was found that the time of 80–120 seconds which was formerly required, could be shortened to 40 seconds or less regardless of the area of the pattern, and a large improvement in productivity was obtained. Further, the occurrence of defects in the mask due to "misses" where defects were not corrected o the pattern printing plate, and irregularities of the pattern on the shadow mask due to poor contact where corrections were made, was thus reduced to approx. $\frac{1}{2}$ or less of the conventional number.

EXAMPLE 2

As shown in FIG. 2(B) and FIG. 2(C), after performing a 1st development and stopping the development as in Example 1, a solution of an oxidizing agent such as copper chloride or potassium dichromate was mixed with a solution of a resin decomposing agent such as ammonia or hydrogen peroxide, and a surfactant was added to give an emulsion etching solution. This solution was sprayed at a pressure of 2 kg/cm$^2$ for 1 to 2 minutes while the plate was irradiated with ultraviolet or green light 9. The opaque emulsion film 7 produced by the 1st development was thereby completely dissolved away so as to leave only a transparent emulsion film 8. The plate was washed under running water in a light room, and the same procedure was performed as after the 2nd development in Example 1 so as to give a pattern printing plate with the same effect as in Example 1.

EXAMPLE 3

Figure 6:
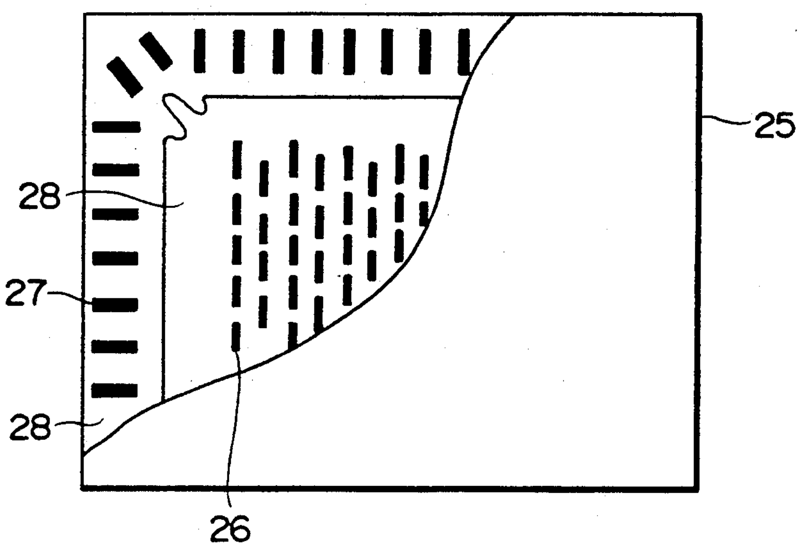
FIG. 6 is a view showing the structure of the pattern printing plate in another embodiment of this invention.

A shadow mask pattern traced on a dry glass plate (for example Kodak HRP) by for example a Gerber Photoplotter was used as a pattern original plate. FIG. 6 is a plan view of the original plate 25. Opaque emulsion films 26 and 27 are formed at points corresponding to apertures in the shadow mask in the effective area and at desired points in the non-effective area respectively, and a transparent emulsion film 28 is formed at other points.

Figure 4A:
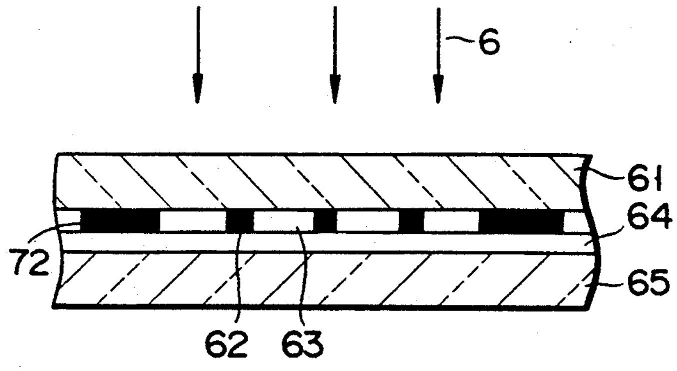
FIGS. 4A to 4D and 5A to 5D are views showing one embodiment of another manufacturing process in this invention.
Figure 4B:
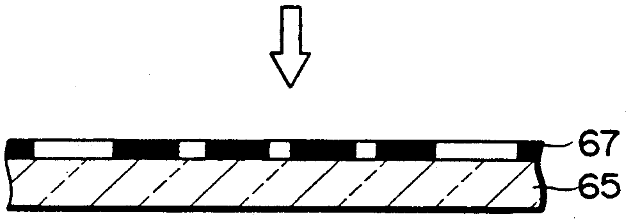
Figure 4C:
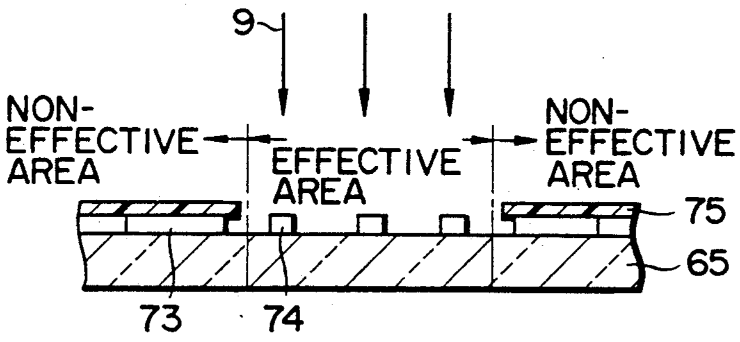
Figure 4D:
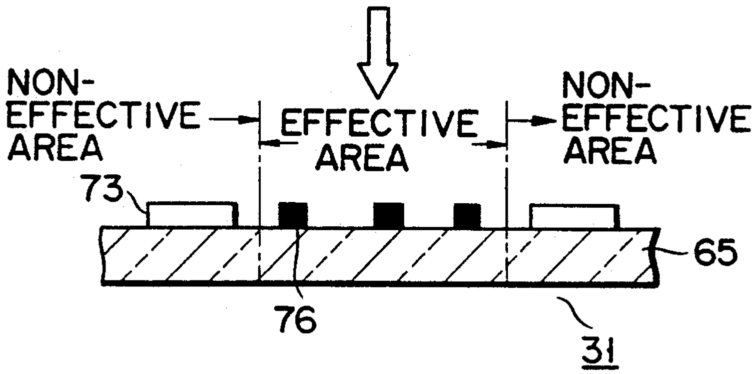

As shown in FIG. 4A, a pattern original plate 61 with opaque emulsion films 62 and a transparent film 63, and a dry glass plate 65 (for example Kodak HRP or LPP, or Konica PL) with an unexposed photosensitive emulsion film 64, are arranged with their emulsion surfaces facing each other in the dark room. After they are brought into close contact with a vacuum system, the photosensitive emulsion film 64 is then irradiated with ultraviolet or green light 6 through the original plate 61 in a 1st exposure. A 1st development is then performed in a developing solution (for example Kodak RT developer) at 20° C. for 3 to 4 minutes, as in ordinary photochemical processing. An opaque emulsion film 67 with a pattern which is the reverse of that on the pattern original plate is thus formed as in FIG. 4(B), and the development is stopped by 3% glacial acetic acid as shown in FIG. 4(B). A solution of an oxidizing agent such as copper chloride or potassium dichromate and a solution of a resin decomposing agent such as ammonia or hydrogen peroxide are then mixed together, and a surfactant is added to give an emulsion etching solution. The pattern printing plate is either immersed in this solution for 1 to 3 minutes, or the solution is sprayed onto the plate at a pressure of 1 to 3 kg/cm$^2$ for approx. 1 to 2 minutes. The opaque emulsion film 67 obtained in the 1st development is thereby dissolved away as shown in FIG. 4(C), and transparent emulsion films 73 and 74 remain. After washing with water, the desired emulsion film 73 situated in the non-effective area is irradiated by ultraviolet light or green light 9 behind a screening plate or a screening film 75, developing nuclei are formed in the silver halides in emulsion film 74 corresponding to the apertures of the shadow mask, and a 2nd development is performed in the same developing solution as in the 1st development. This causes the formation of blackened silver in emulsion film 74 which is opaque, emulsion film 73 remains transparent, and in other parts of the plate, the glass substrate is bare. The development is then stopped, and the plate washed and dried to give the desired shadow mask pattern printing plate 31 as shown in FIG. 4(D).

FIG. 7 shows a plan view of the pattern printing plate 31. As described above, the plate has an opaque emulsion film 32 at points corresponding to the apertures of the shadow mask in the effective area, and a transparent film 33 at desired points. At other points, the glass substrate 34 is bare. The thickness of the emulsion film at this time was 5 μm.

The number of defects on the aperture pattern printing plate manufactured according this invention was $\frac{1}{3}$–$\frac{1}{4}$ compared to a plate manufactured by the conventional 2 contact print process. Further, the printing plate obtained was put into an actual exposure process and a test was performed to see how the time required to achieve vacuum-tight contact could be reduced without affecting mask quality. It was found that whereas conventionally 80–120 seconds was required to achieve contact, 40 seconds or less was required in this example regardless of the pattern area, and productivity was much improved. Further, the occurrence of defects in the mask due to "misses" where defects were not corrected on the pattern printing plate, and irregularities of the pattern on the mask due to poor contact where corrections were made, was thus reduced to approx. $\frac{1}{2}$ or less of the conventional number.

EXAMPLE 4

Figure 5A:
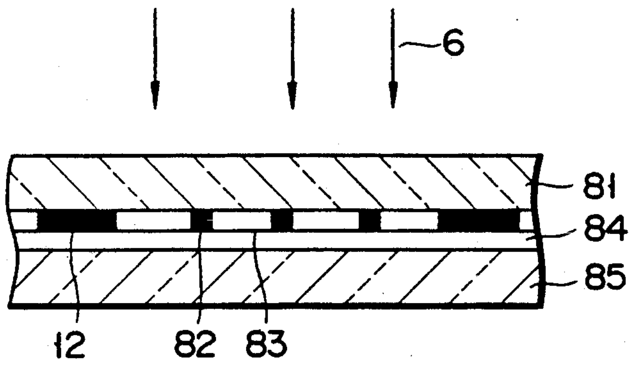
Figure 5B:
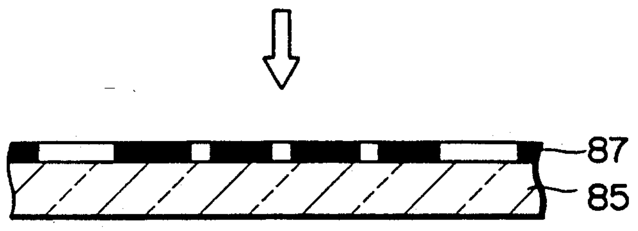
Figure 5C:
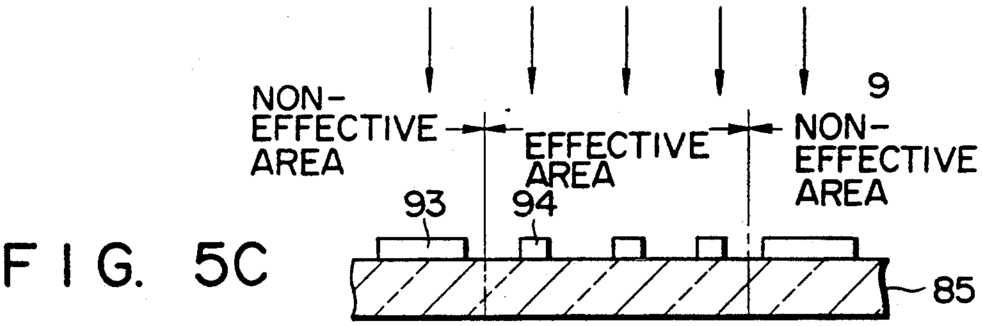
Figure 5D:
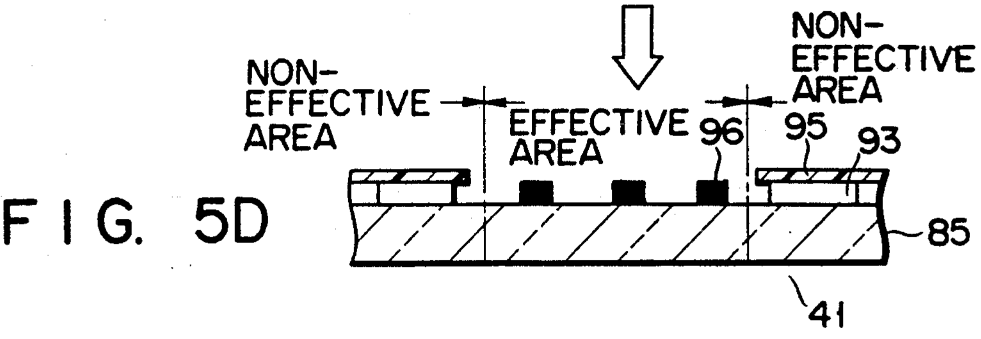

A pattern printing plate was prepared as in FIGS. 5(A) and 5(B) according to the procedures shown in FIG. 4(A) and FIG. 4(B) in Example 3. Next, after processing the reversed pattern 87 to that of the original plate 81 by emulsion etching solution as in Example 3, the whole plate 85 was irradiated by ultraviolet light or green light 9 as shown in FIG. 5(C). This procedure forms developing nuclei in the silver halides of the ( remaining emulsion films 93 and 94. A 2nd development was then performed in the same developing solution as in the 1st development while protecting the plate with a screening plate or screening film 95 such that developing solution did not adhere to the desired emulsion film 93 situated in the non-effective area. The result was that after development there was no formation of blackened silver in transparent photosensitive emulsion film 93 to which there was no developing solution adhering, and the film remained transparent. The plate was then fixed, washed and dried so as to obtain the desired aperture pattern printing plate 41 as shown in FIG. 5(D).

The desired emulsion film 93 situated in the noneffective area of the shadow mask mentioned in the example forms air passages so as not to interfere with the vacuum-tight contact of the shadow mask pattern area. Its shape and position may be conveniently determined by carrying out tests, and are not fixed. Further, if the outer frame pattern of the shadow mask area is formed continuously in the same way as outer frame pattern 24 of Example 1, it obstructs the removal of air from the interior of the shadow mask pattern. Air removal areas may therefore be formed by sightly removing at several locations emulsion film 93 to the extent that it does not affect mask quality.

EXAMPLE 5

A shadow mask pattern drawn on a dry glass plate by a photo plotter is used as an original plate.

Figure 8:
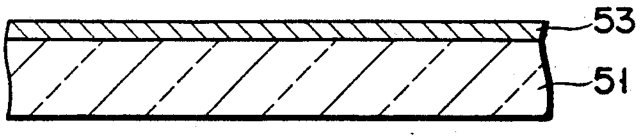
FIGS. 8-12 are sectional views describing the manufacturing process of another embodiment of this invention.

Next, an unexposed glass plate is exposed through the original plate by a mercury lamp, and a master pattern 54 which is the reverse of the original plate is formed by developing, fixing and drying. At the same time, a sheet (for example Fuji Photo Film Banks A-125 or Dupont Liston 3010), consisting of a dry resist film of thickness 20-50 μm on a transparent glass plate, is heated and pressed by a hot roller so as to form a resist film 53 on a transparent glass plate 51 by transfer, as shown in FIG. 8.

Figure 9:
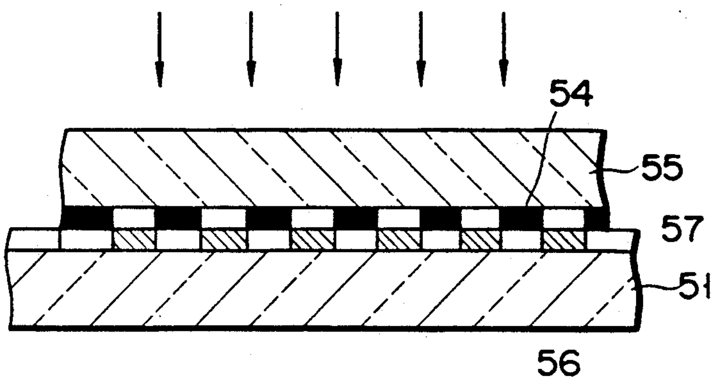

Next, as shown in FIG. 9, a contact reversal exposure using a mercury lamp is performed on glass plate 51 with the unexposed resist film 53, by a dry glass plate 55 with master pattern 54 which was obtained in the previous contact reversal.

Figure 10:
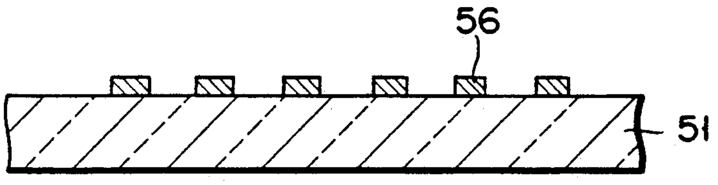

Next, as shown in FIG. 10, the plate is developed by a solution of a weak alkali such as sodium carbonate, washed and dried. The exposed resist film, projecting resist layer 56 corresponding to the apertures of the shadow mask, and the aperture pattern printing plate is thereby obtained.

The resist layer 56 is colored dark blue or red, and it has the property of screening light.

If the coloration is insufficient, resist layer 56 alone may be recolored using a black or red pigment or dye.

In this example, a dry film was used in place of emulsion, which is effective in increasing the thickness of the pattern film.

EXAMPLE 6

A shadow mask pattern drawn on a dry glass plate by a photo plotter is used as an original plate.

Next, the pattern original plate and an unexposed glass plate are exposed by a mercury lamp, and a master pattern 54 which is the reverse of the original plate is formed by developing, fixing and drying. At the same time, a sheet (for example Fuji Photo Film Banks A-125 or Dupont Liston 3010), consisting of a dry resist film of thickness 20-50 μm on a transparent glass plate, is heated and pressed by a hot roller so as to form a resist film 53 on a transparent glass plate 51 by transfer, as shown in FIG. 8.

Next, as shown in FIG. 9, a contact reversal exposure is performed on this glass plate 51 with the unexposed resist film 57, and a dry glass plate 55 with master pattern 54 which was obtained in the previous contact reversal, using a mercury lamp.

Figure 11:
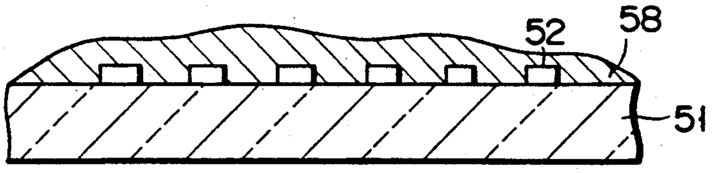

Next, as shown in FIG. 11, the plate is developed with an organic solvent such as trichloroethane. As a result of this procedure, none of the resist film is left in the parts corresponding to the apertures of the shadow mask, and a resist pattern 57 is formed in the other parts. Subsequently, the pits corresponding to the apertures of the shadow mask are filled with an organic material 58 consisting of an aqueous solution of a water-soluble resin (for example polyvinyl alcohol, milk casein or the like) colored with a black or red pigment or dye, and the resin is cured completely by ultraviolet light or a source of heat. The thickness of the organic material 58 filling these pits may be controlled as desired.

Figure 12:
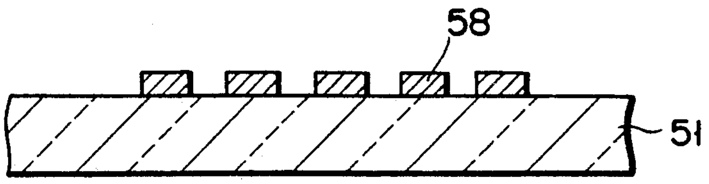

Subsequently, only the resist 57 remaining in parts not corresponding to the apertures of the shadow mask, which was formed first, is dissolved away using an organic solvent such as methylene chloride. An aperture pattern printing plate having a projecting opaque layer 58 corresponding to the apertures of the shadow mask is thus obtained as shown in FIG. 12.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An aperture pattern printing plate for manufacturing shadow masks comprising:
   - a transparent plate; and
   - opaque layer regions formed on a surface of said transparent plate corresponding to apertures in an effective area of a shadow mask, said opaque layer regions projecting from said transparent plate surface and having a thickness of 3 to 50 micrometers.

2. An aperture pattern printing plate as in claim 1, wherein opaque layer region thickness is 5 to 30 micrometers.

3. An aperture pattern printing plate as in claim 1, wherein said transparent plate consists essentially of glass.

4. An aperture pattern printing plate as in claim 1, wherein said opaque layer is formed by exposing a transparent photosensitive emulsion.

5. An aperture pattern printing plate as in claim 1, wherein transparent layer regions are formed on said transparent plate surface corresponding to a non-effective area of said shadow mask, said transparent layer regions projecting from said transparent plate surface.

6. An aperture pattern printing plate according to claim 5, wherein portions of said transparent plate surface having no opaque layer regions and transparent layer regions formed thereon are bare.

7. An aperture pattern printing plate according to claim 1, wherein portions of said transparent plate surface having no opaque layer regions formed thereon are bare.

8. An aperture pattern printing plate according to claim 1, wherein portions of said transparent plate surface having no opaque layer regions formed thereon constitute air passages.

9. An aperture pattern printing plate for manufacturing shadow masks comprising:

a transparent plate; and opaque layer regions formed on a surface of said transparent plate corresponding to apertures in an effective area of a shadow mask, said opaque layer regions projecting from said transparent plate surface and having a thickness of 3-50 micrometers, wherein portions of said transparent plate surface having no opaque layer regions formed thereon are bare and constitute air passages.

* * * * *